US012619622B2

(12) United States Patent
Shimizu et al.

(10) Patent No.: US 12,619,622 B2
(45) Date of Patent: May 5, 2026

(54) DATA COLLECTION DEVICE, PLANT MONITORING SYSTEM AND DATA COLLECTION METHOD

(71) Applicant: Toshiba Mitsubishi-Electric Industrial Systems Corporation, Tokyo (JP)

(72) Inventors: Ryo Shimizu, Tokyo (JP); Naotake Miyasaka, Tokyo (JP); Takato Sonoda, Tokyo (JP)

(73) Assignee: TMEIC CORPORATION, Tokyo (JP)

( * ) Notice: Subject to any disclaimer, the term of this patent is extended or adjusted under 35 U.S.C. 154(b) by 259 days.

(21) Appl. No.: 17/262,748

(22) PCT Filed: Jun. 25, 2019

(86) PCT No.: PCT/JP2019/025163
§ 371 (c)(1),
(2) Date: Jan. 25, 2021

(87) PCT Pub. No.: WO2020/261383
PCT Pub. Date: Dec. 30, 2020

(65) Prior Publication Data
US 2021/0141787 A1 May 13, 2021

(51) Int. Cl.
*G06F 16/248* (2019.01)
*G01R 31/34* (2020.01)
*G06F 16/2458* (2019.01)

(52) U.S. Cl.
CPC ......... *G06F 16/248* (2019.01); *G01R 31/346* (2013.01); *G06F 16/2465* (2019.01)

(58) Field of Classification Search
CPC .. G06F 16/248; G06F 16/2465; G01R 31/346
See application file for complete search history.

(56) References Cited

U.S. PATENT DOCUMENTS

2004/0263342 A1 12/2004 Matlock et al.
2011/0241697 A1* 10/2011 Omatsu .............. G01R 31/1227
                                                                              324/551
(Continued)

FOREIGN PATENT DOCUMENTS

CN     108377255 A     8/2018
CN     108398935 A     8/2018
(Continued)

OTHER PUBLICATIONS

Indian Office Action dated Feb. 2, 2022 in corresponding Indian Application No. 202117002313.
(Continued)

*Primary Examiner* — Apu M Mofiz
*Assistant Examiner* — Husam Turki Samara
(74) *Attorney, Agent, or Firm* — XSENSUS LLP

(57) ABSTRACT

A plant monitoring system comprises: a data collection device configured to collect multiple measured values measured during a plant equipment inspection; and a trend graph display part configured to generate a trend graph based on the multiple measured values. The data collection device comprises: a measured value collection part configured to collect multiple measured values; an event number assignment part configured to assign a same event number or a different event number to the multiple measured values based on a time difference between times at which the multiple measured values were acquired; and a measured value storage part configured to store the multiple measured values. The trend graph display part is configured to render the multiple measured values stored in the measured value storage part in a graph having measured value as a first axis and event number as a second axis.

14 Claims, 5 Drawing Sheets

(56) References Cited

U.S. PATENT DOCUMENTS

| | | | | |
|---|---|---|---|---|
| 2017/0328271 | A1* | 11/2017 | Yamashita | F02B 39/10 |
| 2018/0321836 | A1* | 11/2018 | Tappan | G06F 16/287 |

FOREIGN PATENT DOCUMENTS

| | | | |
|---|---|---|---|
| JP | 2007058559 | A | 3/2007 |
| JP | 4497058 | B2 | 7/2010 |
| JP | 2015-146088 | A | 8/2015 |
| JP | 2018-124697 | A1 | 8/2018 |
| JP | 2019-8435 | A | 1/2019 |
| WO | 2019/097854 | A1 | 5/2019 |

OTHER PUBLICATIONS

International Search Report and Written Opinion mailed on Sep. 3, 2019, received for PCT Application PCT/JP2019/025163, Filed on Jun. 25, 2019, 6 pages including English Translation.
Office Action issued Nov. 21, 2023 in corresponding Chinese Patent Application No. 201980049542.9. with computer-generated English translation thereof.
Office Action issued Feb. 23, 2024 in Indian Patent Application No. 202117002313 (English Translation included). 2 pages.
Office Action issued Oct. 2, 2024 in corresponding Brazilian Patent Application No. 112021001101-3 with English trnaslation thereof.
Office Action issued May 8, 2025 in Brazil Patent Application No. BR112021001101-3 with machine English translation thereof.

* cited by examiner

DATA COLLECTION DEVICE, PLANT MONITORING SYSTEM AND DATA COLLECTION METHOD

CROSS-REFERENCE TO RELATED APPLICATION

The present application is based on PCT filing PCT/JP2019/025163, filed Jun. 25, 2019, the entire contents of which are incorporated herein by reference.

FIELD

The present application relates to a data collection device, a plant monitoring system and a data collection method.

BACKGROUND

Conventionally, for example, JP2019-8435A proposes a method for displaying both alarm information and a trend graph of a device, which had been displayed separately, on a display screen of a trend graph. In this publication, measured values are displayed with the trend graph in a manner in which measurement time is represented in a horizontal axis. This publication also proposes a method for changing a display format of the trend graph during a period in which a failure occurs in the device and an alarm occurs.

CITATION LIST

Patent Literature

[PTL 1] JP2019-8435A

SUMMARY

Technical Problem

In the trend graph where the horizontal axis is set to the measurement time as in the conventional art, visibility may be lowered. An example case where the visibility is lowered includes a case to make the trend graph of a result of an inspection work that can be performed only at a plant shutdown.

An example of the inspection work that can be performed only at the plant shutdown includes a motor winding insulation deterioration inspection that is performed in a steel plant or the like. The motor winding insulation deterioration inspection can only be carried out at the plant shutdown, and the plant shutdown is planned at a frequency of, for example, once a month based on a production plan of the plant.

When measured values of such the motor winding insulation deterioration test are displayed in the trend graph where the horizontal axis is set to the measurement time, the visibility is lowered. This is because when the horizontal axis is set to the measurement time, a large amount of measured values is drawn during the plant shutdown period, whereas no measured value related to the plant operation is drawn. Therefore, the large amount of measured values is drawn in a specific time range, whereas measurement data is blank for a long period during the plant operation. As a result, the visibility of the trend graph is lowered.

It is an object of the present application to provide a data collection device, a plant monitoring system and a data collection method for improving the visibility in which the measurement data is graphed.

Solution to Problem

A data collection device according to the present application comprises:

a measured value collection part that is configured to collect multiple measured values;

an event number assignment part that is configured to assign a same event number to the multiple measured values if a time difference between times at which the multiple measured values were acquired is smaller than a predetermined specified time difference, and is configured to assign a different event number to the multiple measured values if the time difference is greater or equal than the specified time difference; and a measured value storage part that is configured to store the multiple measured values in a state associated with the assigned event number and the multiple measured values.

A plant monitoring system according to the present application comprises:

a data collection device that is configured to collect multiple measured values measured during a plant equipment inspection; and a trend graph display part that is configured to generate a trend graph based on the multiple measured values collected by the data collection device, wherein the data collection device comprises:

a measured value collection part that is configured to collect multiple measured values;

an event number assignment part that is configured to assign a same event number to the multiple measured values if a time difference between times at which the multiple measured values were acquired is smaller than a predetermined specified time difference, and is configured to assign a different event number to the multiple measured values if the time difference is greater or equal than the specified time difference; and a measured value storage part that is configured to store the multiple measured values in a state associated with the assigned event number and the multiple measured values, wherein the trend graph display part is configured to render the multiple measured values stored in the measured value storage part in a graph having measured value as a first axis and event number as a second axis.

A data collection method according to the present application comprises:

a measurement collection step to collect multiple measured values;

a comparison and judgment step to compare a time difference between times at which the multiple measured values were acquired with a predetermined specified time difference;

an event number assignment step to assign a same event number to the multiple measured values if the time difference between times at which the multiple measured values were acquired is smaller than a predetermined specified time difference, and to assign a different event number to the multiple measured values if the time difference is greater or equal than the specified time difference; and a measured value storage step to store the multiple measured values in a state associated with the assigned event number and the multiple measured values.

Effects of Invention

According to data collection device and data collection method of the present application, it is possible to associate the multiple measured values based on the time difference of the measurement time and assign the same event number to the associated measured values. This makes it possible to group a set of the measured values measured at the same time with the same event number. According to plant monitoring system of the present application, the measured values to which such the grouping is performed can be displayed for each event number in a trend graph, which has an advantage of improving the visibility of a user.

DESCRIPTION OF EMBODIMENT

In the following description, multiple measured values $D_n$, multiple times $t_n$, and multiple event numbers #n are used as terms. The subscript "n" is an integer. It is assumed that $n=1, 2, \ldots, k-1, k, k+1$, "k" is any integer. For example, the subscript "k" and the subscript "k+1" are used to describe two consecutive time steps.

A plant monitoring system according to an embodiment is provided as a "motor insulation resistance trend monitoring tool". The motor insulation resistance trend monitoring tool is a tool that automatically performs an insulation resistance measurement between motor windings by using an insulation resistance tester performed for the motor winding insulation deterioration inspection, and displays a transition of the measured insulation resistance in a trend graph.

Figure 1:
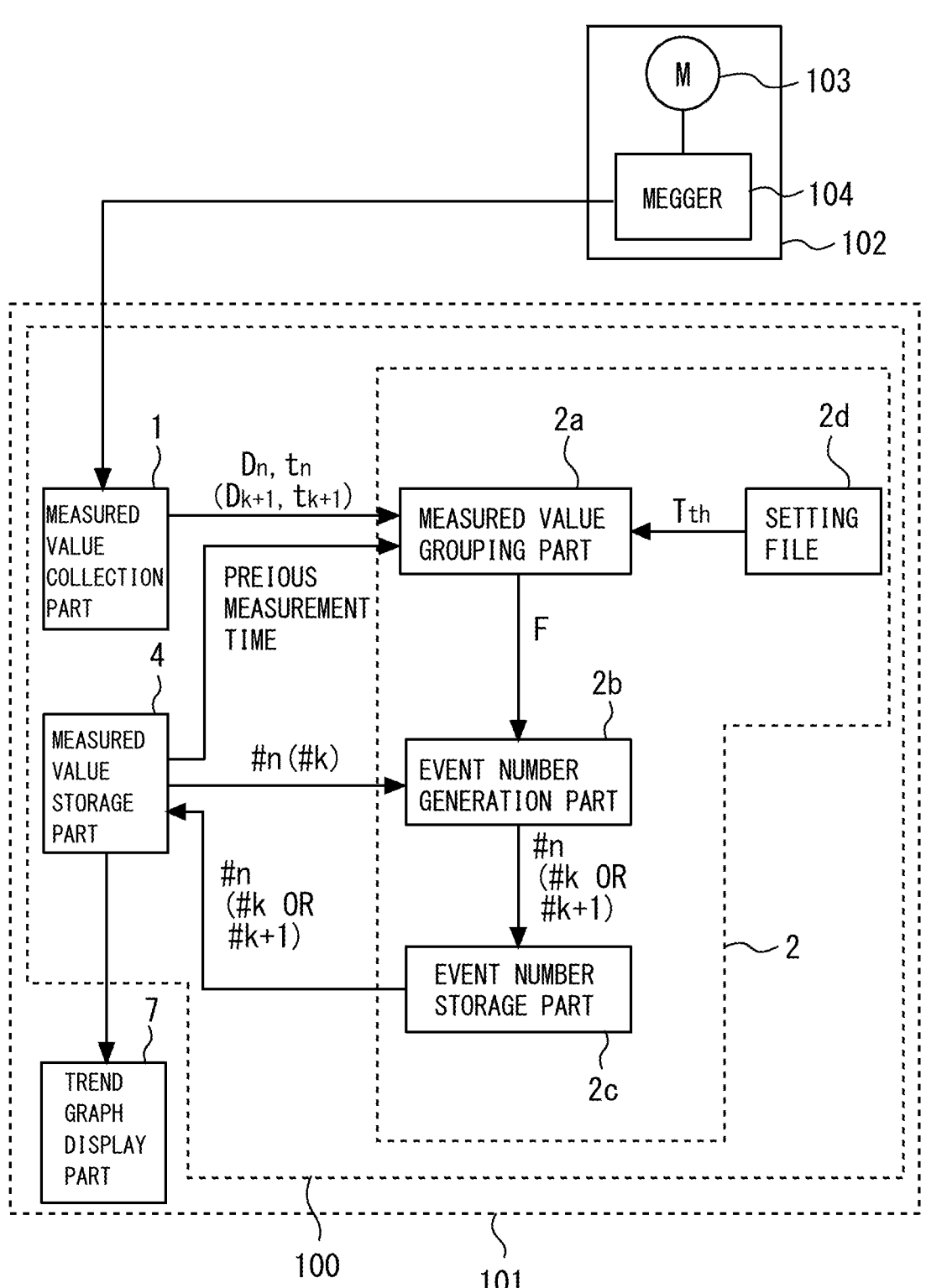
FIG. 1 is a diagram showing a configuration of a data collection device and a plant monitoring system according to an embodiment.

FIG. 1 is a diagram showing a configuration of a data collection device 100 and a plant monitoring system according to the embodiment. FIG. 1 shows the configurations of the plant monitoring system 101 and the data collection device 100 and a dataflow. A plant monitoring system 101 according to the embodiment monitors a plant equipment 102.

The plant equipment 102 includes an electric motor 103 and a megger 104. The megger 104 is the insulation resistance tester. Measured values $D_n$ are electrical property values that are measured in the motor winding insulation deterioration inspection of the electric motor 103. In the embodiment, for example, the measured values $D_n$ shall be current values, as will also be described in graphs shown in FIG. 3 to FIG. 5 described below.

The plant monitoring system 101 includes the data collection device 100 and a trend graph display part 7. The data collection device 100 collects multiple measured values $D_n$ that were measured during an inspection of the plant equipment. The trend graph display part 7 generates the trend graph based on the multiple measured values $D_n$ collected by the data collection device 100.

The data collection device 100 includes a measured value collection part 1, an event number assignment part 2, and a measured value storage part 4. The measured value collection part 1 automatically collects the multiple measured values $D_n$.

Specifically, the measured value collection part 1 collects the measured values $D_n$ that were obtained by performing an inspection work automatically or manually during a plant operation or at a plant shutdown. In the embodiment, it is assumed at the plant shutdown that the insulation resistance measurement between motor windings is automatically performed and the measured values $D_n$ are collected.

First, the measured value collection part 1 collects a new measured value $D_{k+1}$. The measured value collection part 1 transmits the new measured value $D_{k+1}$ and measurement time $t_{k+1}$ at which the new measured value $D_{k+1}$ is collected to a measured value grouping part 2a. In the plant monitoring system according to the embodiment, values of the insulation resistance between the motor windings that are newly collected by the measured value collection part 1 are transmitted to the measured value grouping part 2a.

The event number assignment part 2 calculates a time difference $\Delta T$ between the times at which the multiple measured values $D_k$ and $D_{k+1}$ were acquired. If the time difference $\Delta T$ is less than a predetermined specified time difference Tth, the event number assignment part 2 assigns a same event number #k to the multiple measured values $D_k$ and $D_{k+1}$. If the time difference $\Delta T$ is equal to or greater than the specified time difference Tth, the event number assignment part 2 assigns event numbers #k and #k+1 that are different from each other to the multiple measured values $D_k$ and $D_{k+1}$, respectively.

Specifically, the event number assignment part 2 according to the embodiment includes the measured value grouping part 2a, an event number generation part 2b, an event number storage part 2c, and a setting file 2d. When the measured value grouping part 2a receives the new measured value $D_{k+1}$ and the new measurement time $t_{k+1}$ from the measured value collection part 1, it reads a preset event number change condition from the setting file 2d. The event number change condition includes the specified time difference Tth.

The measured value storage part 4 stores the multiple measured values $D_n$ in a state where the multiple measured values $D_n$ are associated with the event numbers #n. Specifically, when the measured value grouping part 2a receives the new measured value $D_{k+1}$ and the measurement time $t_{k+1}$ from the measured value collection part 1, it reads previous measurement time $t_k$ from the measured value storage part 4.

The measured value grouping part 2a calculates the time difference $\Delta T$ between the new measurement time $t_{k+1}$ and the previous measurement time $t_k$ from respective data obtained by the processing described above. The measured value grouping part 2a compares this time difference $\Delta T$ with the specified time difference Tth of the event number change condition.

If the time difference $\Delta T$ between the measurements is less than the specified time difference Tth of the event number change condition (i.e., $\Delta T<Tth$), the measured value grouping part 2a transmits to the event number generation part 2b an event number setting flag F (F=0) such that the event number is not changed. If the time difference $\Delta T$ between the measurements is equal to or greater than the specified time difference Tth of the event number change condition (i.e., $\Delta T\geq Tth$), the measured value grouping part 2a transmits to the event number generation part 2b the event number setting flag F (F=1) such that the event number is changed (updated).

When event number generation part 2b receives an event number setting flag F from measured value grouping part 2a, it reads event number #k of previous measured value $D_k$ from measured value storage part 4.

The event number generation part 2b adds "1" to the event number #k if the event number generation part 2b receives the event number setting flag F (F=1) indicating that event number should be incremented. The event number generation part 2b transmits an updated event number #k+1 to the event number storage part 2c.

On the other hand, the event number generation part 2b retains the event number #k when the event number generation part 2b receives the event number setting flag F (F=0) indicating that event number should be hold. The event number generation part 2b transmits the event number #k to the event number storage part 2c.

The event number storage part 2c receives the event number for the measured value $D_{k+1}$ from the event number generation part 2b. The received event number is either #k or #k+1 as described above. The event number storage part 2c assigns either #k or #k+1 as the event number to the new measured value $D_{k+1}$ according to the event number transmitted from the event number generation part 2b.

The measured value storage part 4 and the trend graph display part 7 are connected via a wired or wireless communication network. When a trend graph display request is issued from the user, the trend graph display part 7 reads multiple measured values $D_n$, multiple measurement times $t_n$, and multiple event numbers #n from the measured value storage part 4.

The measured value storage part 4 and the trend graph display part 7 may automatically communicate with each other when the trend graph display part 7 is activated. Specifically, the electronic file containing the measured values that were measured in the past (the current values for calculating the insulation resistance between the motor windings) and the measured times $t_n$ by the megger 104, and the event numbers #n is passed and then contents of the electronic file is automatically read.

Note that, in the plant monitoring system according to the embodiment, respective functions shown in FIG. 1 are implemented by dividing into two types of software. The measured value collection part 1, the measured value grouping part 2a, the setting file 2d, the measured value storage part 4, the event number generation part 2b, and the event number storage part 2c are implemented on a first software. The trend graph display part 7 is implemented on a second software. The first software and the second software are installed on separate electronic computers. An electronic computer on which the first software is installed configures the data collection device 100. The electronic computer on which the second software is installed configures the trend graph display part 7.

Figure 2:
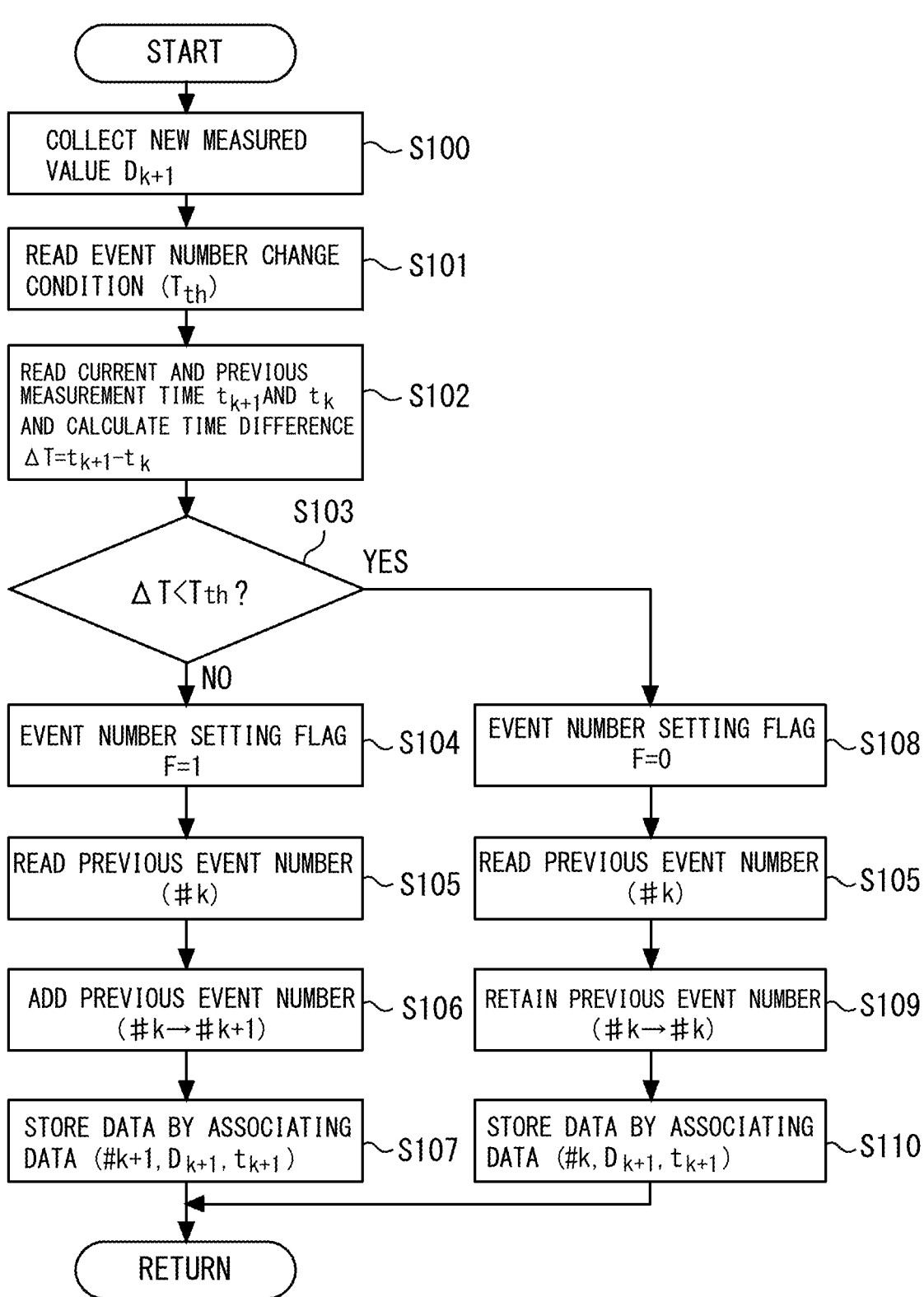
FIG. 2 is a flowchart for explaining an operation of the data collection device according to the embodiment.

FIG. 2 is a flowchart for explaining an operation of the data collection device 100 according to the embodiment. In a routine shown in FIG. 2, first, the new measured value $D_{k+1}$ is collected at step S100 (measurement collection step). Next, the event number change condition (specified time difference Tth) is read out at step S101.

Next, in step S102, based on the measurement time $t_{k+1}$ of the new measured value $D_{k+1}$ and the measurement time $t_k$ of the previous measured value $D_k$, the time difference ΔT is calculated according to the following equation (1).

$$\Delta T = t_{k+1} - t_k \qquad (1)$$

Next, in step S103 (comparison and judgment step), the time difference ΔT and the specified time difference Tth are compared. In accordance with a comparison result, event number assignment steps (steps S104 to S106, S108 and S109) are executed. In the step S103, when if the time difference ΔT is equal to or larger than the specified time difference Tth (ΔT≥Tth), the steps S104, S105, and S106 are executed in this order. In the step S103, if the time difference ΔT is smaller than the specified time difference Tth (ΔT<Tth), the steps S108, S105, and S109 are executed in this order.

If a determination result of the step S103 is ΔT≥Tth, the steps S104, S105, and S106 are executed in this order. In this series of the steps, since the time difference ΔT is equal to or greater than the specified time difference Tth, the event number #k is assign to the measured value $D_k$ and the event number #k+1 is given to the measured value $D_{k+1}$. Specifically, the event number setting flag is set to F=1 in the step S104, and then the previous event number #k is read out (step S105) and an addition is performed (step S106).

If the determination result of the step S103 is ΔT<Tth, the steps S108, S105 and S109 are executed in this order. In this series of the steps, since the time difference ΔT is smaller than the specified time difference Tth, the same event number #k is assigned to the multiple measured values $D_k$ and $D_{k+1}$. Specifically, the event number setting flag is set to F=0 in the step S108, and then the previous event number #k is read out (step S105) and a retaining is performed (step S109).

In the measured value storage steps (steps S107 and S110) the multiple measured values $D_n$ are stored in a state where the event numbers #n are associated with the multiple measured values $D_n$. Specifically, in the step S107 next to the step S106, the current measured value $D_{k+1}$ is stored in association with the time $t_{k+1}$ and updated event number #k+1. Further, in the step S110 next to the step S109, the current measured value $D_{k+1}$ is stored in association with the time $t_{k+1}$ and the previous event number #k.

Then, current routine is ended and the processing is returned. By repeatedly executing the routing shown in FIG. 2, the same data processing is performed for the new measurement values $D_{k+2}$, $D_{k+3}$, and so on.

Here, a technical background of the embodiment will be described. Generally, inspection works on various plant equipment are carried out in various plants such as the steel plant. The inspection work makes it possible to carry out the operation of the plants continuously and stably. Some equipment to be inspected or some inspection types include one on which the inspection work is unable to be performed during a plant operation. For example, in the steel plant, the plant operation is shut down at a frequency of about once a month based on a production plan of a product. During this plant shutdown, the inspection work is carried out that is unable to be carried out during the plant operation.

The motor winding insulation deterioration inspection carried out in the steel plant is an important inspection work to prevent a ground fault of a motor that can contribute to a plant shutdown. After removing a power supply wiring connected to motor terminals from an inverter etc., a measurement work of the insulation resistance is performed with the megger (i.e., the insulation resistance tester) by applying a high voltage between the motor terminals. This is an operation that cannot be performed during the plant operation. The motor winding insulation deterioration inspection can only be carried out in the plant shutdown, and the plant shutdown is planned about once a month based on the production plan of the plant.

In a method of judging a quality of an inspection result by using the measured values, the quality of the equipment to be inspected is judged by the measured values between two consecutive inspection works. However, although a sign of failure appears slowly, there is a case where it does not determined to be a defect in terms of a judgment criteria. In such a case, there is a problem that the failure is difficult to notice.

In such a case, there is a high possibility that a failure occurs suddenly, and if the failure occurs, the operation of the plant is affected. As a countermeasure, a method to capture the sign of the failure by storing the measured values for a long period of time can be considered. A technology that catches the failure sign of the device and notifies the user by mechanically analyzing the trend of the measured values based on rules can be considered.

However, there are many technical problems to establish a technique for mechanically analyzing the trend of the measured values to capture the failure sign of the device. For example, when many disturbances occur in measured results, it is technically difficult to grasp the failure sign with enough accuracy. Therefore, by visualizing the measured values stored for a long period of time with the trend graph, the user can easily predict the failure in advance. The trend graph display part 7 according to the embodiment can satisfy such the visualization needs.

First Comparative Example

A first comparative example may be considered in which the measured values of the motor winding insulation deterioration test is displayed in a trend graph in which the horizontal axis is set to the measurement time. In this first comparative example, a large amount of the measured values is drawn on the plant shutdown period while no measured value is drawn on during the plant operation in a graph with the horizontal axis as measurement time. Therefore, the large amount of measured values is drawn in a specific time range, whereas measurement data is blank for a long period during the plant operation. As a result, the visibility of the trend graph is lowered.

Second Comparative Example

A second comparative example may be considered in which the multiple measured values and the multiple event numbers are associated one-to-one with each other, and then the trend graph is created with the horizontal axis as the event numbers. In this case, since the horizontal axis represents the event numbers rather than time, blank periods during the plant operation are omitted from the trend graph. Therefore, it is possible to suppress a bias of the measured values described in the first comparative example. However, since multiple inspection results performed in one plant shutdown period are related to each other, it is preferable to group them. In this respect, in the second comparative example, since the event numbers are assigned sequentially, there is a risk that groups of related measurement values will disappear. As a result, there is a problem that convenience for finding the failure sign based on the trend graph is lowered.

The comparative example also has problems from other perspectives. The motor winding insulation deterioration inspection measures the current values and calculates the resistivity while applying a high voltage between phases of the motor windings by, for example, the insulation resistance tester. The motor winding insulation deterioration inspection items include a temperature dependence of the motor winding. Preferably, the trend graph is displayed such that a high temperature measured value in a state where the motor wiring temperature immediately after the plant shutdown is high can be compared with a normal temperature measured value in a state where the motor wiring temperature is lowered to close to air temperature over time from the plant shutdown. However, since such temperature information is missing in the event number display as in the second comparative example, there is a disadvantage that it is difficult to make an intuitive comparison.

In the embodiment, to solve the problems in the comparative examples, a grouping is performed by assigning a same event number #n for the measured values, of the multiple measured values $D_n$, of which the measurement times $t_n$ are somewhat close. Visibility can be increased by displaying the grouped measurement values $D_n$ on the graph in an easy-to-understand manner. Further, in the embodiment, unlike the second comparative example, measurement times $t_n$ and event numbers #n are stored separately. Therefore, unlike the second comparative example, the embodiment has an advantage that not only time series information on an event-by-event basis but also precise time information on an individual measurement time can be recorded and maintained.

Figure 3:
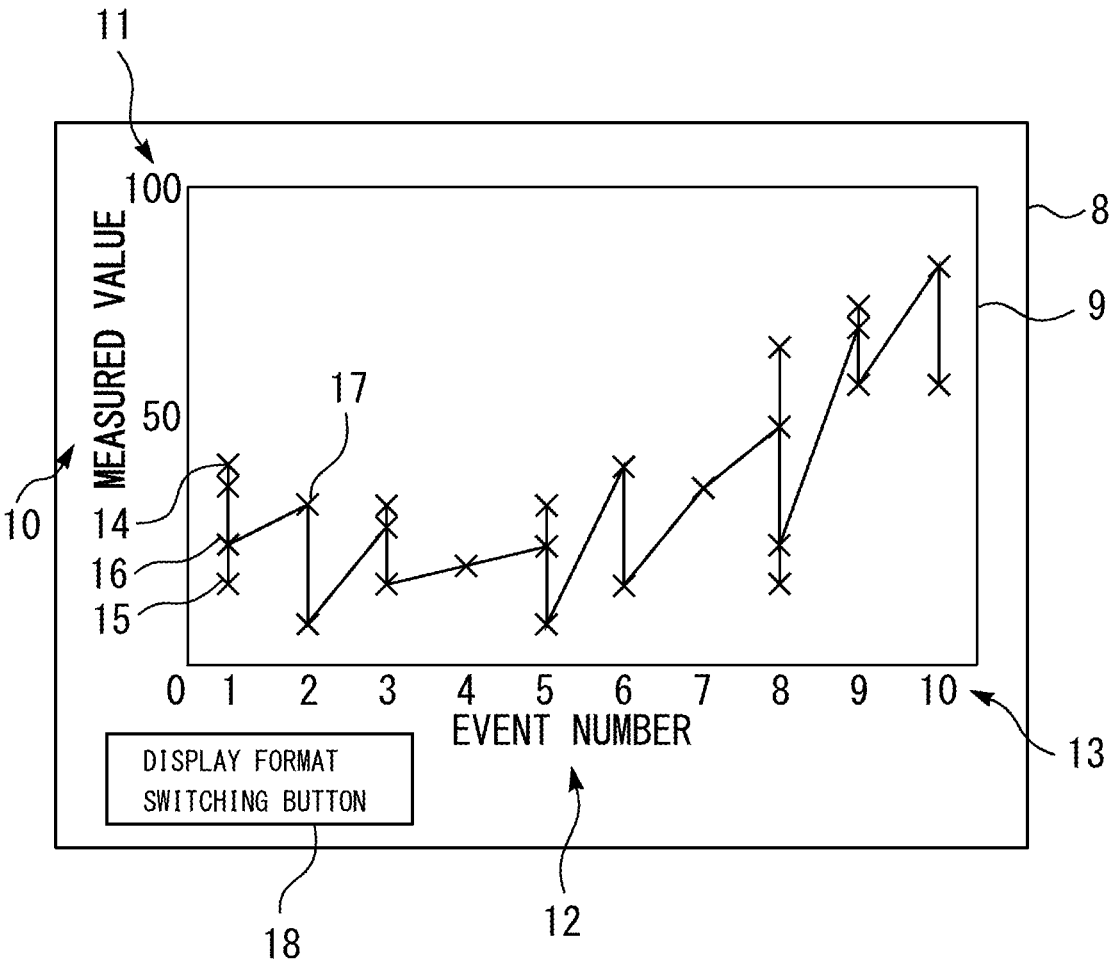
FIG. 3 is an example of a trend graph created by a plant monitoring system according to the embodiment.

FIG. 3 is an example of the trend graph created by the plant monitoring system according to the embodiment. FIG. 3 shows a trend graph display method focusing on individual measured results. Note that in FIG. 3 and FIG. 4 and FIG. 5, which will be described later, the measured values $D_n$ shall be the current values. By converting the current measured values by a predetermined conversion equation, the insulation resistances can be calculated. A mode may be provided for displaying the insulation resistance values to the trend graph.

Trend graph display part 7 draws the multiple measurements $D_n$ stored in the measurement value storage part 4 in the graph of FIG. 3 where the measurement values $D_n$ are in a first axis and the event numbers #n are in a second axis. In the embodiment, a x-y Cartesian coordinate graph is created in which the first axis is the vertical axis and the second axis is the horizontal axis.

In the plant monitoring system according to the embodiment, when a GUI (Graphical User Interface) of a tool on which the trend graph display part 7 is mounted is pressed, a screen including a trend graph window 8 is displayed. In the trend graph window 8, a trend graph display area 9, a vertical axis legend 10, a vertical axis range 11, a horizontal axis legend 12, and a horizontal axis range 13 are displayed. In the trend graph display area 9, the trend graph is displayed in which the current values between the motor windings and the event numbers #n are plotted on a two-dimensional coordinate in accordance with the vertical axis range 11 and the horizontal axis range 13.

In the plant monitoring system according to the embodiment, the event number change condition may be set in consideration of a difference in the operation shutdown time for each plant. The event number change condition is specifically the specified time difference Tth.

The event number assignment part 2 may be configured such that a number of distinct values are set to the specified time difference Tth. A plurality of specified time differences Tth1, Tth2, Tth3, . . . having different sizes from each other may be selectively used in consideration of the difference in the operation shutdown time for each plant. Depending on the plant shutdown time, appropriate specified time difference Tth can be set.

Within a single plant shutdown, values of the insulation resistance between the motor windings are automatically measured multiple times. In the trend graph shown in FIG. 3, a maximum measured value plot 14 and a minimum measured value plot 15 in an event number #1 are connected by a straight line. In addition, event number #1 final measured value plot 16 and first measured value plot 17 in the following event number #2 are connected by a straight line.

If the trend graph is displayed with the event numbers #n as the horizontal axis, the measurement times $t_n$ cannot be checked correctly. Therefore, in the embodiment, when a display format switching button 18 is pressed, processing to change the horizontal axis to time is executed (see FIG. 5). If the display format switching button 18 is pressed again after changing the horizontal axis to time, the horizontal axis is able to return to the event numbers #$D_n$.

The measurement times can associate the multiple measured values $D_n$ based on the time difference $\Delta T$, and the same event number #n is assigned to the associated measured values $D_n$. This allows the user to intuitively understand the measurement results because the measured values $D_n$ that are related to each other in the trend graph are displayed for each event number #n.

If a simple time-series data display is adopted in which the measurement values $D_n$ are arranged on the time axis for inspection items with a long-term inspection interval, chunks of the multiple measurements $D_n$ will exist discretely on the time axis. As a result, visibility is lowered. In this regard, by summarizing the measured values $D_n$ for each event number #n, it is possible to draw the trend graph that increases the visibility and is easy to understand intuitively.

As shown in FIG. 3, the trend graph display part 7 may be configured to draw the multiple measured values $D_n$ with the same event number #n in a direction perpendicular to the horizontal axis (i.e., a direction parallel to the vertical axis).

The trend graph display method in which the multiple measured values $D_n$ with the same event number #n are distinguished from the multiple measured values $D_n$ with other event number #n may be modified in various ways. As one example of the modifications, by separating in the second axis the multiple measured values $D_n$ to which the same event number #n are assigned from the multiple measured values $D_n$ to which the other event number #n, thereby these may be distinguished from each other. This is a trend graph display method that separates a spatial arrangement of the measurement values on the graph, and the example shown in FIG. 3 is also a type of this trend graph display method.

As another example of the modifications, a trend graph display method in which different symbols are used on the graph. This is the trend graph display method in which the multiple measured values $D_n$ are shown on the graph with the same event number #n by using a first symbol, while the multiple measured values $D_n$ are shown on the graph with the other event number #n by using a second symbol being different from the first symbol, thereby these may be distinguished from each other.

As still another example of the modifications, a trend graph display method in which different display colors on the graph may be used. This is the trend graph display method in which the multiple measured values $D_n$ are shown on the graph with the same event number #n by using a first color, while the multiple measured values $D_n$ are shown on the graph with the other event number #n by drawing a second color being different from the first color, thereby these may be distinguished from each other.

It should be noted that two or more of the grouping method for separating the spatial arrangements on the graph, the grouping method using different symbols, and the grouping method using different colors may be combined.

As shown in FIG. 3, the trend graph display part 7 may be configured to draw a line chart that connects the multiple measured values $D_n$ in an order of acquisition times.

Figure 4:
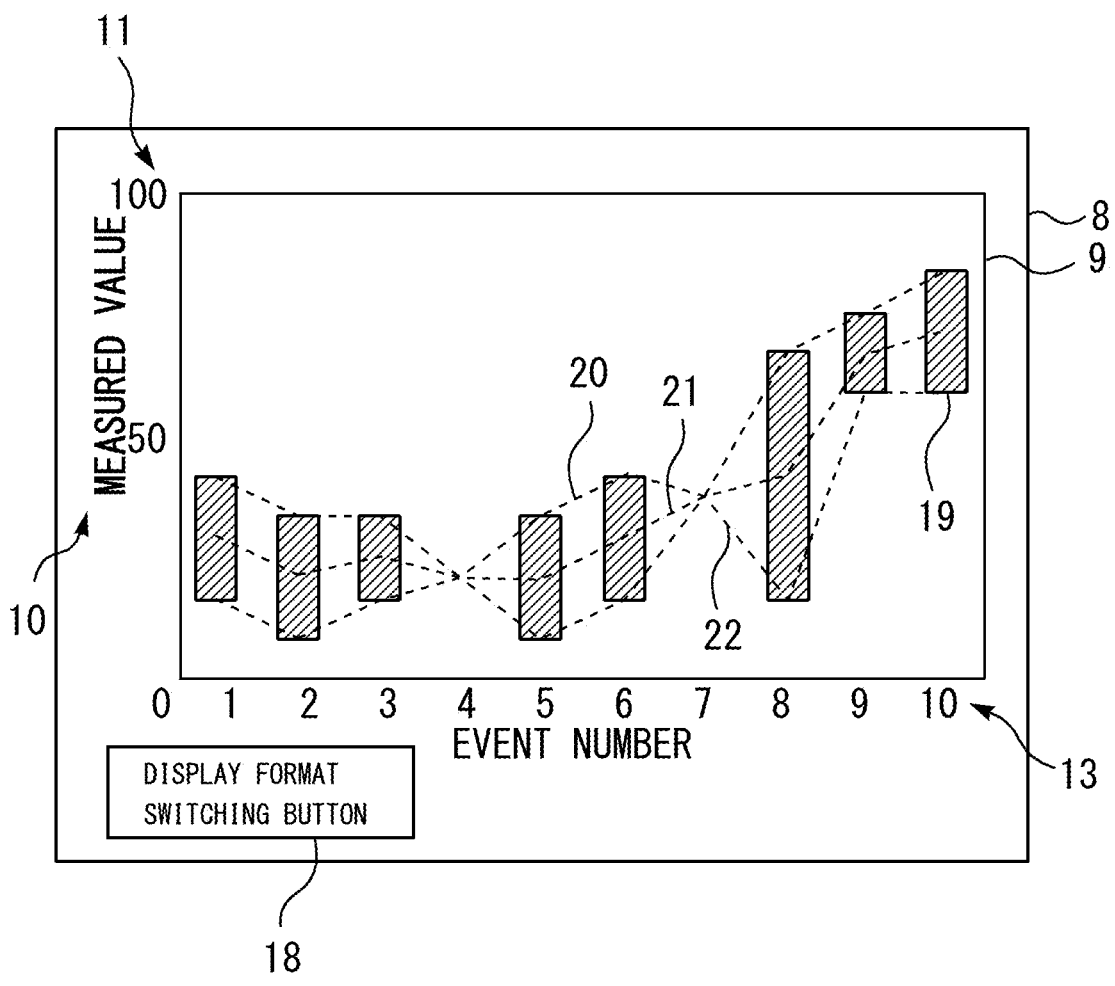
FIG. 4 is another example of the trend graph created by the plant monitoring system according to the embodiment.

FIG. 4 is another example of the trend graph created by the plant monitoring system according to the embodiment. FIG. 4 shows a trend graph display method focusing on a maximum value, a minimum value, and an average value.

The inspection items of the motor winding insulation deterioration inspection include the temperature dependence of the motor winding. The trend graph is preferably displayed such that the temperature dependence of the measured values can be visually recognized. That is, the measured values include a high temperature measured value in a state where motor wiring temperature immediately after the plant shutdown is high, and a low temperature measured value in a state where the motor wiring temperature is lowered to air temperature after a long time from the plant shutdown. It is preferable that high temperature measured value and the low temperature measured value can be visually recognized separately such that the temperature dependence can be visually recognized.

For this purpose, it is preferable to monitor the transition by focusing on the maximum value, the minimum value, and the average value measured in the events, respectively. Therefore, as shown in FIG. 4, processing to display at least one of an in-event measured value range 19, a measured maximum value trend graph 20, a measured average value trend graph 21, and a measurement minimum value trend graph 22 may be implemented in the trend graph display part 7.

As shown in FIG. 4, the trend graph display part 7 may be configured to draw the measured maximum value trend graph 20. In the embodiment, for example, the measured maximum value trend graph 20 links maximum values of the multiple measured values $D_n$ with the first event number #n to maximum values of the multiple measured values $D_n$ with the second event number #n next to the first event number #n. As a modified example, a fitting function such as an approximate curve or various statistical graphs such as a moving averaging line may be created based on each maximum value data, and these graphs may be used as an approximate measured maximum value trend graph.

As shown in FIG. 4, the trend graph display part 7 may be configured to draw the measured minimum value trend graph 22. In the embodiment, for example, the measurement minimum value trend graph 22 links minimum values of the multiple measured values $D_n$ with the first event number #n to minimum values of the multiple measured values $D_n$ with the second event number #n next to the first event number #n. As a modified example, a fitting function such as an approximate curve or various statistical graphs such as a moving averaging line may be created based on each maximum value data, and these graphs may be used as an approximate measured minimum value trend graph.

As shown in FIG. 4, the trend graph display part 7 may be configured to draw the measured average value trend graph 21. In embodiment, for example, the measured average value trend graph 21 links average values of the multiple measured values $D_n$ with the first event number #n to average values of the multiple measured values $D_n$ with the second event number #n next to the first event number #n. As a modified example, a fitting function such as an approximate curve or various statistical graphs such as a moving averaging line may be created based on each maximum value data, and these graphs may be used as an approximate measured average value trend graph.

As shown in FIG. 4, the trend graph display part 7 may be configured to draw the in-event measured value range 19. The in-event measured value range 19 represents a range determined by the maximum value and the minimum value of the multiple measured values $D_n$ with the same event number #n. The in-event measured value range 19 makes it possible to see visually how much the measured value has changed in a single event. The in-event measured value range 19 may be a bar graph as shown in FIG. 4.

Figure 5:
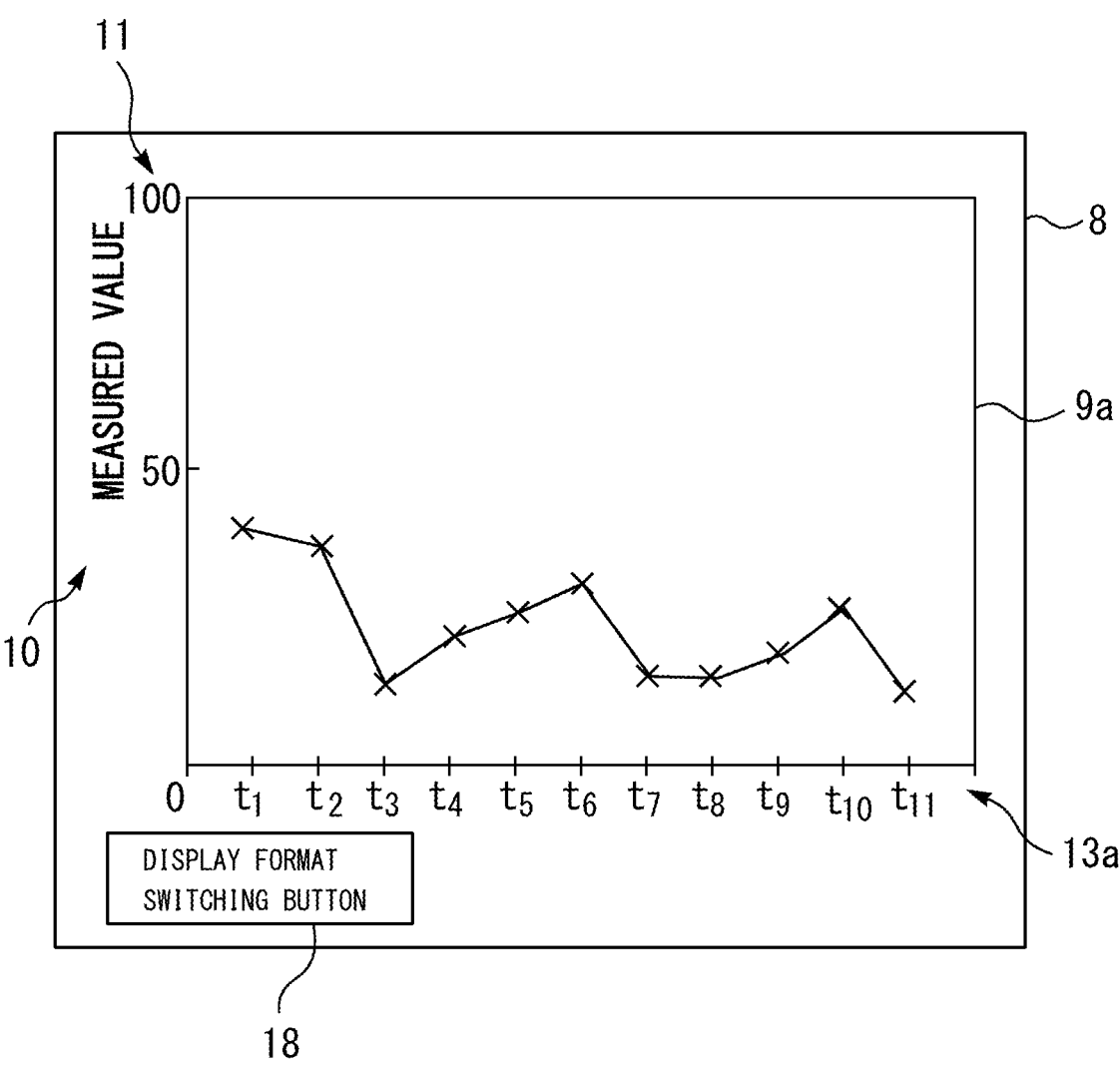
FIG. 5 is still another example of the trend graph created by the plant monitoring system according to the embodiment.

FIG. 5 is still another example of the trend graph created by the plant monitoring system according to the embodiment. A scale of a horizontal axis range 13a of FIG. 5 is the times $t_n$. The trend graph display part 7 may be configured to reversibly switch a unit of the horizontal axis between the event numbers #n and times responsive to an input operation of a switching instruction via the display format switching button 18.

It should be noted that the embodiment has been described by using the index n for convenience of explanation. However, the values of the index n are not necessarily synchronized between the measured values $D_n$ and the times $t_n$ and the event numbers #n. The number of the event numbers #n can be sufficiently small as compared to the number of the measured values $D_n$ and the times $t_n$. This is because, for example, a large number of the measured values $D_{k-1}$, $D_k$ and $D_{k+1}$ may be associated with the single event number #k.

In the embodiment, as an example, the measured values $D_n$ is explained the electrical property value measured in the motor winding insulation deterioration inspection. Specifically, the measured values $D_n$ according to the embodiment are current values. However, the data collection device 100 and the plant monitoring system 101 according to the embodiment can be diverted into various types of data collection, and the measured values $D_n$ can be varied in a variety of ways. The measured values $D_n$ may be measured values for other inspection items that are not of the motor winding insulation deterioration inspection. The measured values $D_n$ may be other physical property values other than electrical property values (e.g., a thermal property value, a mechanical property value, a magnetic property value, a chemical property value, etc.).

REFERENCE SIGNS LIST

1 Measured value collection part 2 Event number assignment part 2a Measured value grouping part 2b Event number generation part 2c Event number storage part 2d Setting file 4 Measured value storage part 7 Trend graph display part 8 Trend graph window 9 Trend graph display area 10 Vertical axis legend 11 Vertical axis range 12 Horizontal axis legend 13, 13a Horizontal axis range 14 Maximum measured value plot 15 Minimum measured value plot 16 Final measured value plot 17 First measured value plot 18 Display format switching button 19 In-event measured value range 20 Measured maximum value trend graph 21 Measured average value trend graph 22 Measurement minimum value trend graph 100 Data collection device 101 Plant monitoring system 102 Plant equipment 103 Electric motor 104 Megger F Event number setting flag Tth Specified time difference ΔT Time difference

The invention claimed is:

1. A plant monitoring method comprising:
collecting multiple measured values using a resistance tester with respect to an inspection item of a plant equipment as an inspection target installed in a plant during a plant equipment inspection performed during each of a plurality of shutdown periods of the plant, the plant equipment including an electric motor, and the multiple measured values including electrical property values directly measured using the resistance tester in an insulating degradation check of a motor winding included in the electric motor;

comparing and judging a time difference indicating a difference between two measurement times of two consecutive measured values included in the multiple measured values with a predetermined specified time difference, wherein the predetermined specified time difference is variably set for each of a plurality of shutdown periods based on the plurality of shutdown periods, respectively;

assigning an event number to the multiple measured values collected during each of the plurality of shutdown periods of the plant, wherein a same event number is assigned to the two consecutive measured values if the time difference is smaller than the predetermined specified time difference, whereas a different event number is assigned to the two consecutive measured values if the time difference is greater or equal than the specified time difference;

storing the multiple measured values in a state associated with the assigned event number and the multiple measured values collected during each of the plurality of plant shutdown periods;

generating a trend graph based on the stored multiple measured values, the trend graph having measured value as a first axis and event number as a second axis, the multiple measured values having same event number being displayed as a group in association with visible information of temperature dependence of the motor winding; and displaying the trend graph on a graphical user interface operated by a user to predict failure of the plant equipment, in response to a request from the user through the graphical user interface, by drawing a bar graph corresponding an in-event measured value range for each group of the multiple measured values having same event number, respectively.

2. A non-transitory computer-readable storage medium including computer executable instructions, wherein the instructions, when executed by a plant monitoring system, cause the plant monitoring system to perform a method, the method comprising:

collecting multiple measured values using a resistance tester with respect to an inspection item of a plant equipment as an inspection target installed in a plant during a plant equipment inspection performed during each of a plurality of shutdown periods of the plant, the plant equipment including an electric motor, and the multiple measured values including electrical property values directly measured using the resistance tester in an insulating degradation check of a motor winding included in the electric motor;

comparing and judging a time difference indicating a difference between two measurement times of two consecutive measured values included in the multiple measured values with a predetermined specified time difference, wherein the predetermined specified time difference is variably set for each of a plurality of shutdown periods based on the plurality of shutdown periods, respectively;

assigning an event number to the multiple measured values collected during each of the plurality of shutdown periods of the plant, wherein a same event number is assigned to the two consecutive measured values if the time difference is smaller than the predetermined specified time difference, whereas a different event number is assigned to the two consecutive measured values if the time difference is greater or equal than the specified time difference;

storing the multiple measured values in a state associated with the assigned event number and the multiple measured values collected during each of the plurality of plant shutdown periods; and generating a trend graph based on the stored multiple measured values, the trend graph having measured value as a first axis and event number as a second axis, the multiple measured values having same event number being displayed as a group in association with visible information of temperature dependence of the motor winding, and displaying the trend graph on a graphical user interface operated by a user to predict failure of the plant equipment, in response to a request from the user through the graphical user interface, by drawing a bar graph corresponding an in-event measured value range for each group of the multiple measured values having same event number, respectively.

3. The non-transitory computer-readable storage medium according to claim 2, wherein the method further comprising:

drawing the bar graph including a maximum value and a minimum value in the in-event measured value range for the multiple measured values to which the same event number has been assigned.

4. The non-transitory computer-readable storage medium according to claim 3, wherein the maximum value in the multiple measured values is a high temperature measured value in a state where a motor winding temperature of the motor winding is high immediately after the plant shutdown, wherein the minimum value in the multiple measured values is a low temperature measured value in a state where a motor winding temperature of the motor winding is almost air temperature after a predetermined time from the plant shutdown, and wherein the bar graph connecting the maximum value and the minimum value in the multiple measured values to which the same event number has been assigned is drawn to provide the visible information of temperature dependence of the motor winding.

5. The non-transitory computer-readable storage medium according to claim 2, wherein:

the predetermined specified time difference is variably set based on a duration of each of the plurality of shutdown periods; and the bar graph corresponds to an in-event measured value range for each group of the multiple measured values having the same event number, respectively, the bar graph connecting a maximum value and a minimum value in the in-event measured value range, the method further comprising:

drawing a measured maximum value trend graph connecting the maximum value in each group to the maximum value in a subsequent group and a measured minimum value trend graph connecting the minimum value in each group to the minimum value in a subsequent group.

6. The non-transitory computer-readable storage medium according to claim 2, wherein the second axis includes consecutive integers corresponding to the assigned event numbers, thereby collapsing time between the plurality of shutdown periods on the trend graph.

7. The plant monitoring method according to claim 1, wherein the electrical property values are current values measured by an insulation resistance tester.

8. The plant monitoring method according to claim 1, further comprising drawing a measured maximum value trend graph by connecting a maximum value in each group of the multiple measured values having the same event number to a maximum value in a subsequent group.

9. The plant monitoring method according to claim 1, further comprising switching a unit of the second axis of the trend graph between the event number and time responsive to an input of a switching instruction via the graphical user interface.

10. The plant monitoring method according to claim 1, wherein assigning the event number comprises:

generating an event number setting flag based on the comparison of the time difference with the predetermined specified time difference; and updating the event number for a subsequent measured value based on the event number setting flag.

11. The plant monitoring method according to claim 1, wherein assigning a different event number comprises incrementing a previous event number by adding one to generate a new event number.

12. The plant monitoring method according to claim 1, comprising:

drawing the bar graph including a maximum value and a minimum value in the in-event measured value range for the multiple measured values to which the same event number has been assigned.

13. The plant monitoring method according to claim 12, wherein the maximum value in the multiple measured values is a high temperature measured value in a state where a motor winding temperature of the motor winding is high immediately after the plant shutdown, wherein the minimum value in the multiple measured values is a low temperature measured value in a state where a motor winding temperature of the motor winding is almost air temperature after a predetermined time from the plant shutdown, and wherein the bar graph connecting the maximum value and the minimum value in the multiple measured values to which the same event number has been assigned is drawn to provide the visible information of temperature dependence of the motor winding.

14. The plant monitoring method according to claim 12, wherein the second axis includes consecutive integers corresponding to the assigned event numbers, thereby collapsing time between the plurality of shutdown periods on the trend graph.

* * * * *